United States Patent
Riedel et al.

(10) Patent No.: US 9,818,982 B2
(45) Date of Patent: Nov. 14, 2017

(54) OPTOELECTRONIC ASSEMBLY AND METHOD FOR PRODUCING AN OPTOELECTRONIC ASSEMBLY

(71) Applicant: OSRAM OLED GmbH, Regensburg (DE)

(72) Inventors: Daniel Riedel, Regensburg (DE); Thomas Wehlus, Lappersdorf (DE); Nina Riegel, Tegernheim (DE); Silke Scharner, Regensburg (DE); Johannes Rosenberger, Regensburg (DE); Arne Fleissner, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/326,504

(22) PCT Filed: Jul. 3, 2015

(86) PCT No.: PCT/EP2015/065226
§ 371 (c)(1),
(2) Date: Jan. 16, 2017

(87) PCT Pub. No.: WO2016/008743
PCT Pub. Date: Jan. 21, 2016

(65) Prior Publication Data
US 2017/0214002 A1    Jul. 27, 2017

(30) Foreign Application Priority Data

Jul. 17, 2014 (DE) .................. 10 2014 110 054

(51) Int. Cl.
*H01L 51/52* (2006.01)
*H01L 51/00* (2006.01)
(Continued)

(52) U.S. Cl.
CPC ........ *H01L 51/5271* (2013.01); *H01L 25/048* (2013.01); *H01L 27/3206* (2013.01);
(Continued)

(58) Field of Classification Search
CPC ... H01L 51/00; H01L 51/009; H01L 51/0096; H01L 51/52; H01L 51/521; H01L 51/522;
(Continued)

(56) References Cited

U.S. PATENT DOCUMENTS 4,153,905 A    5/1979   Charmakadze et al.
6,639,249 B2 * 10/2003  Valliath ................. H01L 27/156
                                                                257/88
(Continued)

FOREIGN PATENT DOCUMENTS

DE          2813918 A1      10/1978
DE     202013008610 U1       4/2014
(Continued)

OTHER PUBLICATIONS

German Search Report based on application No. 10 2014 110 054.9 (8 pages) dated Oct. 10, 2014.
(Continued)

*Primary Examiner* — Monica D Harrison
(74) *Attorney, Agent, or Firm* — Viering, Jentschura & Partner mbB

(57) ABSTRACT

An optoelectronic assembly includes an optoelectronic component having a surface light source for emitting a light on a substrate which is at least partly transmissive for the light emitted by the surface light source, wherein the optoelectronic component includes at least one first main emission surface and a second main emission surface wherein the second main emission surface is situated opposite the first main emission surface, and a reflective structure which is arranged at least partly in the beam path of the light emitted
(Continued)

by the surface light source and is designed to reflect at least part of the light impinging on the reflective structure in the direction of the substrate, such that a laterally offset image of the surface light source is generatable. The reflective structure and the optoelectronic component are arranged at a distance from one another in a range of approximately 1 mm to approximately 1000 mm.

18 Claims, 9 Drawing Sheets

(51) Int. Cl.
    *H01L 25/04*     (2014.01)
    *H01L 51/56*     (2006.01)
    *H01L 27/32*     (2006.01)

(52) U.S. Cl.
    CPC ...... *H01L 51/0096* (2013.01); *H01L 51/5218* (2013.01); *H01L 51/5221* (2013.01); *H01L 51/5253* (2013.01); *H01L 51/56* (2013.01); *H01L 2251/5361* (2013.01)

(58) Field of Classification Search
    CPC ............ H01L 51/5218; H01L 51/5221; H01L 51/5253; H01L 51/56; H01L 51/5271
    USPC .......................................................... 257/89
    See application file for complete search history.

(56) References Cited

U.S. PATENT DOCUMENTS

| | | |
|---|---|---|
| 6,803,603 B1 | 10/2004 | Nitta et al. |
| 2002/0131145 A1 | 9/2002 | Lin et al. |
| 2004/0048429 A1 | 3/2004 | Baur et al. |
| 2004/0070014 A1 | 4/2004 | Lin et al. |
| 2008/0055901 A1 | 3/2008 | Sanpei et al. |
| 2009/0224276 A1 | 9/2009 | Igari et al. |
| 2012/0268932 A1 | 10/2012 | Lerman et al. |
| 2014/0362567 A1 | 12/2014 | Dobbertin et al. |

FOREIGN PATENT DOCUMENTS

| | | |
|---|---|---|
| EP | 1406474 A1 | 4/2004 |
| EP | 2461208 A1 | 6/2012 |
| WO | 2013104471 A1 | 7/2013 |
| WO | 2014048553 A2 | 4/2014 |

OTHER PUBLICATIONS

International Search Report based on application No. PCT/EP2015/065226 (5 pages and 3 pages of English translation) dated Sep. 30, 2016.

* cited by examiner

OPTOELECTRONIC ASSEMBLY AND METHOD FOR PRODUCING AN OPTOELECTRONIC ASSEMBLY

RELATED APPLICATIONS

The present application is a national stage entry according to 35 U.S.C. §371 of PCT application No.: PCT/EP2015/065226 filed on Jul. 3, 2015, which claims priority from German application No.: 10 2014 110 054.9 filed on Jul. 17, 2014, and is incorporated herein by reference in its entirety.

TECHNICAL FIELD

Various embodiments generally relate to an optoelectronic assembly and to a method for producing an optoelectronic assembly.

SUMMARY

In various applications, for example in the automotive field, flat surface light sources which have a depth or spatial effect for an observer are desired.

Conventional surface light sources have no spatial effect or depth effect. In order to generate a spatial effect in the case of a surface light source, a component depth is necessary which renders the surface light source unsuitable for a large number of applications in which flat components are required.

SUMMARY

Various embodiments provide an optoelectronic assembly having an improved depth or spatial effect. As a result, light patterns or entire luminaires having a depth effect and/or 3D effects can be provided from flat organic light emitting diode structures.

In accordance with one aspect of the present disclosure, the object is achieved by means of an optoelectronic assembly including an optoelectronic component and a reflective structure. The optoelectronic component includes a surface light source on a substrate. The surface light source is designed for emitting a light. The substrate is formed such that it is at least partly transmissive for the light emitted by the surface light source. The optoelectronic component includes at least one first main emission surface and a second main emission surface. The reflective structure is arranged at least partly in the beam path of the light emitted by the surface light source and is designed to reflect at least part of the light impinging on the reflective structure in the direction of the substrate, such that the reflected light is emitted through the substrate. The reflective structure and the optoelectronic component are arranged at a distance from one another in a range of approximately 1 mm to approximately 1000 mm, for example in a range of approximately 3 mm to approximately 100 mm, for example in a range of approximately 5 mm to approximately 75 mm.

The second main emission surface can be situated opposite the first main emission surface. The substrate and the reflective structure form an optical cavity.

The light emitted through the substrate is at a lateral distance from the light emitted directly by the surface light source. As a result, illustratively a laterally offset image of the surface light source can be generated, as a result of which a spatial effect and/or a depth effect are/is generated in the image plane. The emission of the reflected light through the substrate of the optoelectronic component and the distance between the reflective structure and the optoelectronic component thus make it possible that a three-dimensional effect can be brought about in a two-dimensional luminous structure. The depth impression can be higher than the structural depth by a multiple.

Furthermore, the substrate includes an optically inactive region alongside the surface light source. As a result, the reflected light can be emitted alongside the surface light source through the substrate. The image of the surface light source alongside the direct emission of the surface light source mediates the depth effect and/or spatial effect in the image plane of the optoelectronic assembly. The proportion of the optically inactive region alongside the surface light source is in a range of approximately 5% to approximately 90%, for example in a range of approximately 10% to 80%, for example in a range of approximately 20% to 60%.

In accordance with one development, the surface light source is at least partly transmissive for the light reflected by the reflective structure. This makes it possible that the structure of the reflective structure is visible through the surface light source. As a result, a pattern represented on the reflective structure or information represented on the reflective structure can be visible in the image plane. The superimposition of the reflected light with the light emitted in the surface light source can lead to a depth effect.

In accordance with one development, the surface light source is formed as a component which emits light on one side. This makes it possible that the luminance of the optoelectronic component can be increased in a simple manner, for example by virtue of the surface light source being optimized in terms of its efficiency toward emission on one side. By way of example, the surface light source may include a highly reflective electrode. Furthermore, this makes it possible that optical effects as a result of high contrasts and shadings can be utilized when the assembly is observed. These effects can additionally be angle-dependent when the assembly is observed, since the distances between luminous surface and mirror surface change as a result of tilting.

In accordance with another development, the surface light source is formed as a component which emits light at least bidirectionally. This makes it possible that an optoelectronic assembly having a depth effect and/or spatial effect can be realized by means of a single surface light source and/or by means of one or a plurality of surface light source(s) on a single side of the substrate.

In accordance with one development, the optoelectronic component includes on the substrate at least one first surface light source and a second surface light source, wherein the first surface light source emits a first light and the second surface light source emits a second light. The first surface light source is arranged at a first distance alongside and/or above the second surface light source on the substrate.

The first surface light source at a first distance alongside the second surface light source can be formed as a segmented surface light source. This enables new design possibilities for the optoelectronic assembly, for example an interaction of the spatial effects and/or depth effects of the first surface light source and the second surface light source, for example a spatially acting color and/or intensity gradient. Furthermore, non-gradual segmented effects can also occur laterally.

The first surface light source at a first distance above the second surface light source can be formed as a back-to-back arrangement. This makes it possible, in a simple manner, to use surface light sources which emit light on one side in optoelectronic components which emit bidirectionally. The production of the optoelectronic assembly can be simplified as a result.

In accordance with one development, the first light differs from the second light in at least one property, for example the color locus, the brightness, the saturation and/or the color bin and/or the angle-dependent emission characteristic. This enables new design possibilities for the spatial effect and/or depth effect laterally in the image plane of the optoelectronic assembly. By way of example, surface light sources arranged alongside one another and having different color bins can represent a lateral color gradient.

Alternatively or additionally, in the case of surface light sources arranged one above another, a color gradient in the spatial effect or depth effect can be realized in a simple manner. By way of example the first light source emits the light emitted directly, that is to say optically actively, by the first main emission surface; and the second light source emits the light reflected by the reflective structure and emitted through the substrate. As a result, in the image plane the second surface light source as an apparent spatially deeper image of the first surface light source can have a light having a different intensity, a different color locus, for example a different color bin, and/or a different polarization than the first surface light source.

The first surface light source can be formed in such a way that the first light is emitted into the first main emission surface; and the second surface light source can be formed in such a way that the second light is emitted into the second main emission surface. This makes it possible that an optical difference in the directly emitted light and the light emitted in a reflected fashion, that is to say the image of the directly emitting surface light source, can be realized in a simple manner.

In accordance with another development, the substrate is formed such that it is partly reflective for impinging light, for example for the light reflected by the reflective structure; for example as a partly transmissive mirror. This makes it possible that the light reflected by the substrate is at least partly reflected toward the reflective structure. Said light is in turn deflected by the reflective structure toward the substrate and partly emitted through the substrate. This transmitted light is at a greater distance from the surface light source than the light which is reflected by the reflective structure and emitted through the substrate only once. The spatial effect and/or depth effect of the optoelectronic assembly can thus be set in a simple manner by means of the reflectivity of the substrate.

In accordance with one development, the reflective structure is formed such that it is at least partly transmissive for at least part of the light impinging on the reflective structure. By way of example, the reflective structure is formed as a partly transmissive mirror. This makes it possible that the optoelectronic assembly can be formed in a simple manner as an optoelectronic assembly which emits on both sides and/or a transparent optoelectronic assembly.

In accordance with one development, the optoelectronic assembly furthermore includes an at least partly transmissive structure. The at least partly transmissive structure is arranged in the beam path of the emitted light between an image plane of the optoelectronic assembly and the optoelectronic component. The partly transmissive structure is at least partly transmissive for light impinging on the partly transmissive structure from the surface light source and/or the reflective structure. The at least partly transmissive structure acts as a mechanical protection for the optoelectronic component against bends or scratches. The partly transmissive structure is for example the cover of the optoelectronic component.

In accordance with one development, the partly transmissive structure is formed and arranged in such a way that at least part of the light impinging on the partly transmissive structure from the surface light source and/or the reflective structure is reflected. The partly transmissive structure is formed for example as a partly transmissive mirror or partly transparent mirror. The light impinging on the partly transmissive structure is reflected in the direction of the substrate and/or the reflective structure. From the substrate and/or the reflective structure said light is in turn at least partly reflected back in the direction of at least the partly transmissive structure. In other words: part of the light is deflected toward the reflective structure by the partly transmissive structure. Said light is in turn deflected toward the partly transmissive structure and partly emitted through the substrate. As a result, the spatial effect and/or depth effect of the optoelectronic assembly can be set in a simple manner.

In accordance with one development, the surface light source includes at least one at least partly reflective electrode. The at least partly reflective electrode is formed for reflecting the light emitted by the surface light source. The at least partly reflective electrode is at least one part of the reflective structure. This enables the reflective structure to be formed in a simple manner. In this case, the distance between the optoelectronic component and the reflective structure is settable by means of the distance between the optoelectronic component and the at least partly transmissive structure.

In accordance with a further aspect of the present disclosure, the object is achieved by means of a method for producing an optoelectronic assembly, wherein the method includes forming an optoelectronic component having a surface light source on a substrate. The surface light source is formed for emitting a light. The substrate is formed such that it is at least partly transmissive for the light emitted by the surface light source. The optoelectronic component is formed in such a way that it includes at least one first main emission surface and a second main emission surface. Furthermore, the method includes forming a reflective structure and arranging the reflective structure in such a way that the reflective structure is arranged at least partly in the beam path of the light emitted by the surface light source and is designed to reflect at least part of the light impinging on the reflective structure in the direction of the substrate, such that the reflected light is emitted through the substrate. The reflective structure and the optoelectronic component are arranged at a distance from one another in a range of approximately 1 mm to approximately 1000 mm, for example in a range of approximately 3 mm to approximately 100 mm, for example in a range of approximately 5 mm to approximately 75 mm.

The second main emission surface can be situated opposite the first main emission surface. Arranging the reflective structure at a distance in a range of 1 mm to 1000 mm above the optoelectronic component makes it possible that the reflected light becomes visible alongside the surface light source. As a result, a surface light source having a spatial effect or depth effect can be realized in a simple manner.

In accordance with one development, forming the optoelectronic component includes segmenting a surface light source into at least one first surface light source and a second surface light source, for example structuring at least one electrically conductive layer of the surface light source. This makes it possible that a surface light source having a plurality of light emitting segments having a depth effect and/or a spatial effect can be produced in a simple manner.

In accordance with one development, the optoelectronic component is adhesively bonded on or above the reflective structure.

This makes it possible that the distance between the reflective structure and the optoelectronic component can be fixed with regard to mechanical vibrations in a simple manner.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
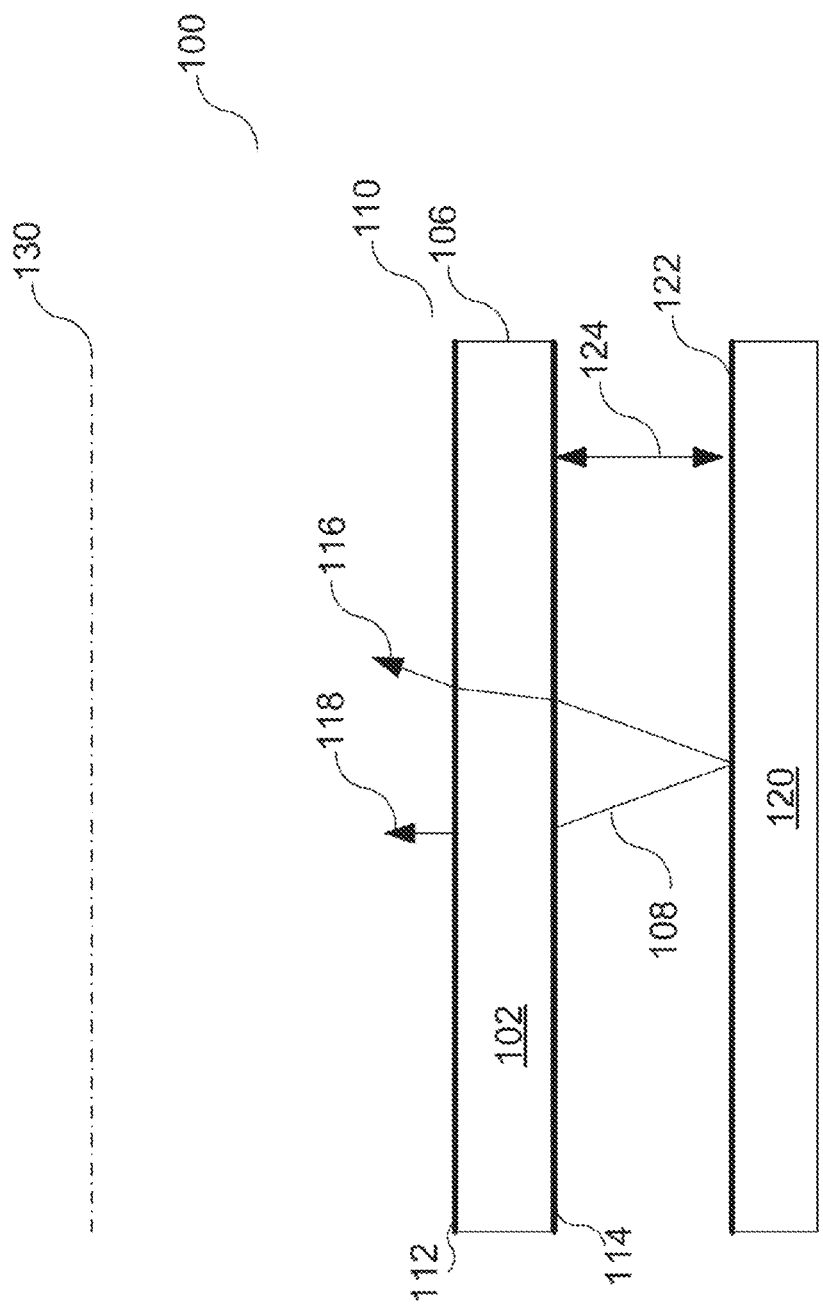
FIG. 1 shows a schematic sectional illustration of one exemplary embodiment of an optoelectronic assembly.

In the following detailed description, reference is made to the accompanying drawings, which form part of this description and show for illustration purposes specific exemplary embodiments in which the present disclosure can be implemented. In this regard, direction terminology such as, for instance, "at the top", "at the bottom", "at the front", "at the back", "front", "rear", etc. is used with respect to the orientation of the figure(s) described. Since component parts of exemplary embodiments can be positioned in a number of different orientations, the direction terminology serves for illustration and is not restrictive in any way whatsoever. It goes without saying that other exemplary embodiments can be used and structural or logical changes can be made, without departing from the scope of protection of the present disclosure. It goes without saying that the features of the various exemplary embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

An optoelectronic component may include one, two or more optoelectronic components. Optionally, an optoelectronic assembly can also include one, two or more electronic components. An electronic component may include for example an active and/or a passive component. An active electronic component may include for example a computing, control and/or regulating unit and/or a transistor. A passive electronic component may include for example a capacitor, a resistor, a diode or a coil.

An optoelectronic component can be an electromagnetic radiation emitting component or an electromagnetic radiation absorbing component. An electromagnetic radiation absorbing component can be for example a solar cell or a photodetector. In various exemplary embodiments, an electromagnetic radiation emitting component can be an electromagnetic radiation emitting semiconductor component and/or be formed as an electromagnetic radiation emitting diode, as an organic electromagnetic radiation emitting diode, as an electromagnetic radiation emitting transistor or as an organic electromagnetic radiation emitting transistor. The radiation can be for example light in the visible range, UV light and/or infrared light. In this context, the electromagnetic radiation emitting component can be formed for example as a light emitting diode (LED), as an organic light emitting diode (OLED), as a light emitting transistor or as an organic light emitting transistor. In various exemplary embodiments, the light emitting component can be part of an integrated circuit. Furthermore, a plurality of light emitting components can be provided, for example in a manner accommodated in a common housing.

A surface light source appears within the photometric limit distance as a planar surface which diffusely emits an electromagnetic radiation, for example a planar organic light emitting diode and/or a screen. For the case where the image plane of the optoelectronic assembly lies outside the photometric limit distance, the surface light source appears as a point light source. In one development, the surface light source is a point light source, in particular for the case where the image plane is arranged at a distance from the first main emission surface which is greater than the photometric limit distance.

The electromagnetic radiation emitted by the surface light source can be collimated or focused by one or a plurality of optical components, such that a directional beam is formed.

At least one of the following structures is formed as partly transmissive and/or reflective for the light emitted by the surface light source: the substrate, the reflective structure, the partly transmissive structure. As a result, one part of the electromagnetic radiation impinging on the respective structure is reflected and another part passes through the structure.

In the case of the partly transmissive structures mentioned above, with regard to the intensity of the electromagnetic radiation impinging on the structure—depending on the wavelength, the polarization and/or the angle of incidence of the impinging electromagnetic radiation—a proportion in a range of approximately 10% to approximately 95% is transmitted through the structure, for example in a range of approximately 25% to approximately 90%, for example in a range of approximately 45% to approximately 85%.

In the case of the partly reflective structure mentioned above, with regard to the intensity of the electromagnetic radiation impinging on the structure—depending on the wavelength, the polarization and/or the angle of incidence of the impinging electromagnetic radiation—a proportion in a range of approximately 10% to approximately 95% is reflected by the structure, for example in a range of approximately 25% to approximately 90%, for example in a range of approximately 45% to approximately 85%.

A main emission surface of an optoelectronic component is a planar region of the optoelectronic component which emits a significant portion of the emitted electromagnetic radiation, for example in a range of approximately 10% to approximately 100% of the total emission of the optoelectronic component. The region of the optoelectronic component in the main emission surface is optically active and includes an electroluminescent or photoluminescent layer. Alternatively, the region of the optoelectronic component in the main emission surface is optically passive and is translucent or transparent with regard to the emitted electromagnetic radiation.

The reflective structure or an at least partly reflective structure reflects an electromagnetic radiation impinging on the reflective structure. In various developments, a reflective structure can be formed as an optical grating, a metallic mirror or mirrors, a photonic crystal or a total internal reflection interface. A mirror structure is formed such that it is completely or partly reflective for electromagnetic radiation in a wavelength range and/or having a polarization, for example as a partly transmissive reflective structure, for example as a dichroic mirror. The partly transmissive reflective structure can be for example a splitter mirror and/or a one-way mirror. The partly transmissive reflective structure can reflect for example one part of the electromagnetic radiation impinging or incident on it. Another part of the incident electromagnetic radiation passes through the partly transmissive reflective structure.

A dielectric layer system can be provided on one side of the reflective structure. Additionally or alternatively, a reflection-reducing is provided on the other side. As an alternative or in addition to the dielectric layer system, a highly reflective coating can be used, for example a very thin metal coating. A partly transmissive and simultaneously partly reflective structure is formed for example as a dichroic mirror, a photonic crystal or a one-way mirror. In other words: one of the structures mentioned above can have differing transmissivity or transmission and/or reflection coefficients or reflectances for one or more wavelengths, directions of polarization or directions of incidence of the electromagnetic radiation, for example visible light.

In various developments, the partly transmissive structure and/or the substrate of the optoelectronic component are/is formed in accordance with one of the above-described developments of the reflective structure.

FIG. 1 illustrates a schematic sectional illustration of one exemplary embodiment of an optoelectronic assembly.

The optoelectronic assembly 100 includes an optoelectronic component 110 and a reflective structure 120.

The optoelectronic component 110 includes a first main emission surface 112 and a second main emission surface 114.

The first main emission surface 112 is situated opposite the second main emission surface 114.

The optoelectronic component 110 includes at least one surface light source 102 on a substrate 106, as will also be described in greater detail below. The surface light source 102 is formed for emitting a light, as described in even greater detail below. The substrate 106 is formed such that it is at least partly transmissive for the light emitted by the surface light source 102.

The optoelectronic component 110 is formed in such a way that a first light 118 is emitted by the first main emission surface 112, and that a second light 108 is emitted by the second main emission surface 114.

Furthermore, the optoelectronic assembly 100 includes a reflective structure 120 having a reflective surface 122 or reflective layer structure for impinging light.

The reflective structure 120 is arranged at a distance from the first main emission surface 112 and/or the second main emission surface 114, for example illustrated in FIG. 1 by means of the arrow 124. An optical cavity is formed by means of the distance 124 between the second main emission surface 114 and the reflective surface 122. Part of the light 108 emitted by the surface light source 102 from the second main emission surface 114 is guided in the optical cavity.

The reflective structure 120 is arranged relative to the optoelectronic component 110 in such a way that the light 108 emitted by the surface light source 102 from the first main emission surface 112 (see FIG. 9, for example) and/or the second main emission surface 114 impinges on the reflective structure 120. At least part of said light 108 is reflected at or from the reflective structure 120 in the direction of the substrate 106 and emitted through the substrate 106 into the image plane 130, for example illustrated in FIG. 1 by means of the arrow 126.

The light 116, 118 emitted by the optoelectronic component 110 from the first main emission surface 112 is ascertainable by an observer in the image plane 130.

The distance 124 between the second main emission surface 114 or the substrate 106 and the reflective structure 120 is set in such a way that the light 116 emitted by the reflective structure 120 is visible in the image plane 130 in a manner laterally offset alongside the light 118 emitted directly by the surface light source 102 in the direction of the image plane 130, for example as a double image or a blurred image of the surface light source 102. By means of the main emission surface 112, 114 and the distance 124 between the optoelectronic component 110 and the reflective structure 120, a distance is formed between the directly emitted light 118 and the light 116 emitted by means of the reflection of the impinging light 108 at the reflective structure 120 and through the substrate 106. By means of the distance, the optoelectronic assembly 100 appears to be three-dimensional to an observer in the image plane 130, that is to say that a depth impression of the optoelectronic assembly 100 arises.

Consequently, in the case of an optoelectronic assembly 100 as a relatively thin planar light source 100, the impression of a spatial effect can be generated for the observer. This enables new design options for optoelectronic assemblies 100.

In other words: the surface light source 102 is arranged at a distance 124 above the reflective structure 120 in such a way that the substrate 106 and the reflective structure 120 form an optical cavity. Alternatively or additionally, the optical cavity is formed by means of the surface light source 102 and the reflective structure 120. The distance 124 between the surface light source 102 and the reflective structure 120 for the purpose of achieving the spatial effect or depth effect should be configured in such a way that the light emitted by the surface light source 102 during the operation of the optoelectronic assembly is optically distinguishable from the light 116 reflected by the reflective structure 120. As a result, the reflected-emitted light 116 becomes emittable with a spatial offset with respect to the directly emitted light 118, thereby enabling a spatial effect and/or depth effect.

In other words: an optoelectronic assembly 100 is provided which includes an optoelectronic component 110 and a reflective structure 120. The optoelectronic component 110 includes a surface light source 102 on a substrate 106. The surface light source 102 is designed for emitting a light 108, 118. The substrate 106 is formed such that it is at least partly transmissive for the light 108, 118 emitted by the surface light source 102. The optoelectronic component 110 includes at least one first main emission surface 112 and a second main emission surface 114, wherein the second main emission surface 114 is situated opposite the first main emission surface 112. The reflective structure 120 is arranged at least partly in the beam path of the light 108 emitted by the surface light source 102 and is designed to reflect at least part of the light 108 impinging on the reflective structure 120 in the direction of the substrate 106, such that the reflected light 116 is emitted through the substrate 106. The reflective structure 120 and the optoelectronic component 110 are arranged at a distance 124 from one another in a range of approximately 1 mm to approximately 1000 mm; for example of approximately 1 mm to approximately 200 mm, for example in a range of approximately 3 mm to approximately 100 mm, for example in a range of approximately 5 mm to approximately 75 mm.

The first main emission direction 112 of the optoelectronic component 110 faces away from the reflective structure 120 and the second main emission direction 114 of the optoelectronic component 110 faces the reflective structure 120.

The substrate 106 is a glass carrier or includes a glass carrier. In one development, the substrate includes a reflective layer. The layer is transmissive at least for the light emitted by the surface light source. The substrate 106 can thus be formed as a partly transmissive mirror. In one development, the substrate 106 is formed such that it is partly reflective for impinging light, for example for the light 116 reflected by the reflective structure 120. By way of example, the substrate 106 is formed as a partly transmissive mirror.

In one development, the reflective structure 120 includes a reflective surface 122. Impinging light 108 emitted by the surface light source 102 is reflected by the reflective surface 122. Alternatively or additionally, the reflective structure 120 includes a reflective layer structure for at least part of the impinging light. By way of example the reflective layer structure is formed in the form of a photonic crystal.

In one development, the reflective structure 120 includes a structuring, for example in the form of a curved, bent, concave, convex, trench-shaped and/or lens-shaped structuring of the reflective surface 122 or reflective layer structure. By way of example, the reflective structure is a bent mirror. An optoelectronic assembly 100 having a lens effect can be realized as a result.

In one development, the reflective structure 120 is formed such that it is at least partly transmissive for at least part of the light impinging on the reflective structure 120, for example in the form of a partly transmissive mirror.

In one development, the reflective structure 120, the substrate 106 and/or the surface light source 102 are/is formed in such a way that the reflected light 116 differs from the light 118 emitted directly by the surface light source 102 in at least one property, for example in the color locus, the brightness, the saturation and/or the color bin. For this purpose, the reflective structure 120 and/or the substrate include(s) for example a wavelength-converting substance that alters the wavelength of the impinging light. The surface light source 102 is formed for example such that it emits light bidirectionally, or includes a back-to-back arrangement of a first surface light source and a second surface light source. A first light 118 is emitted by the first surface light source of the back-to-back arrangement or a first side of the bidirectional surface light source in a first direction, that is to say emitted directly into the image plane 130. A second light 108 is emitted by the second surface light source of the back-to-back arrangement or a second side of the bidirectional surface light source in a second direction, that is to say is emitted in the direction of the reflective structure 120. The bidirectional surface light source or surface light source having a back-to-back arrangement can be formed in such a way that first light differs from the second light.

Figure 2:
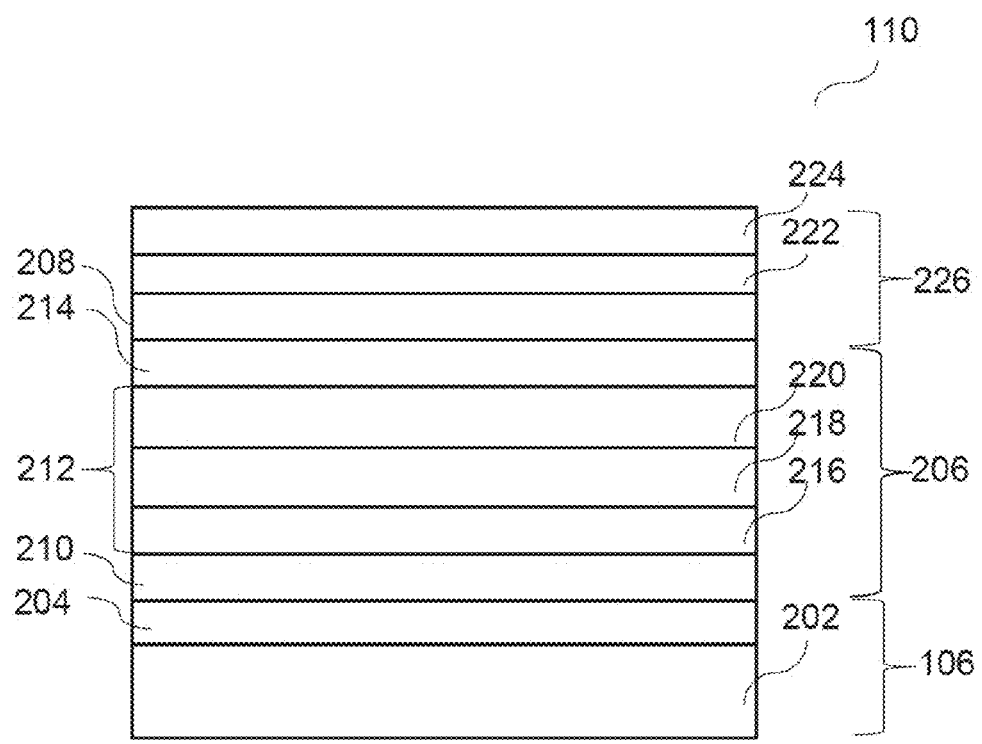
FIG. 2 shows a schematic sectional illustration of one exemplary embodiment of an optoelectronic component of the optoelectronic assembly.

FIG. 2 illustrates a schematic sectional illustration of one exemplary embodiment of an optoelectronic component 110 of the optoelectronic assembly 100. The optoelectronic component 110 largely corresponds to the optoelectronic component 110 shown in FIG. 1.

The optoelectronic component 110 includes a hermetically impermeable substrate 106, an active region 206 and an encapsulation structure 226.

The hermetically impermeable substrate 106 includes a carrier 202 and a barrier layer 204. The hermetically impermeable substrate 106 carries the electrically active region 206 and protects the latter against penetration of a substance that is harmful to the electrically active region 206, for example oxygen and/or water vapor.

The electrically active region 206 includes a first electrode 210, an organic functional layer structure 212 and a second electrode 214. The active region 206 is an electrically active region 206 and/or an optically active region 206. The active region is for example the region of the optoelectronic component 110 in which electric current for the operation of the optoelectronic component 110 flows and/or in which electromagnetic radiation is generated and/or absorbed.

The encapsulation structure 226 may include a second barrier thin-film layer 208, a connection layer 222 and a cover 224. The encapsulation structure 226 surrounds the electrically active region 206 and protects the latter against penetration of a substance that is harmful to the electrically active region 206, for example oxygen and/or water vapor.

The carrier 202 includes or is formed from glass, quartz and/or a semiconductor material. Alternatively or additionally, the carrier includes or is formed from a plastics film or a laminate including one or including a plurality of plastics films. The plastic is one or a plurality of polyolefins (for example high or low density polyethylene (PE) or polypropylene (PP)), polyvinyl chloride (PVC), polystyrene (PS), polyester and/or polycarbonate (PC), polyethylene terephthalate (PET), polyethersulfone (PES) and/or polyethylene naphthalate (PEN). Alternatively or additionally, the carrier 202 includes or is formed from a metal, for example copper, silver, gold, platinum, iron, for example a metal compound, for example steel.

The carrier 202 can be formed as a waveguide for the electromagnetic radiation, for example can be transparent or translucent with respect to the emitted electromagnetic radiation.

The barrier layer 204 is arranged on or above the carrier 202 on the side of the active region 206 and/or the side facing away from the active region 206.

The barrier layer 204 includes or is formed from one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminumdoped zinc oxide, poly(p-phenylene terephthalamide), nylon 66, and mixtures and alloys thereof.

The barrier layer 204 is formed by means of one of the following methods: an atomic layer deposition (ALD) method, for example a plasma enhanced atomic layer deposition (PEALD) method or a plasmaless atomic layer deposition (PLALD) method; a chemical vapor deposition (CVD) method, for example a plasma enhanced chemical vapor deposition (PECVD) method or a plasmaless chemical vapor deposition (PLCVD) method; or alternatively by means of other suitable deposition methods.

The barrier layer 204 has a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

The barrier layer 204 is optional if the carrier 202 is already hermetically impermeable, for example includes or is formed from a glass, a metal or a metal oxide.

The first electrode 210 is formed as an anode or as a cathode. The first electrode 210 is formed on or above the carrier 202 and/or the barrier layer.

The first electrode 210 includes or is formed from one of the following electrically conductive materials: a metal; a transparent conductive oxide (TCO); a network composed of metallic nanowires and nanoparticles, for example composed of Ag, which are combined with conductive polymers, for example; a network composed of carbon nanotubes which are combined with conductive polymers, for example; graphene particles and graphene layers; a network composed of semiconducting nanowires; an electrically conductive polymer; a transition metal oxide; and/or the composites thereof. The first electrode 210 composed of a metal or including a metal includes or is formed from one of the following materials: Ag, Pt, Au, Mg, Al, Ba, In, Ca, Sm or Li, and compounds, combinations or alloys of these materials, for example Mo/Al/Mo; Cr/Al/Cr; Ag/Mg, Al. Alternatively or additionally, the first electrode 210 includes a transparent conductive oxide of one of the following materials: for example metal oxides: for example zinc oxide, tin oxide, cadmium oxide, titanium oxide, indium oxide, or indium tin oxide (ITO). Alongside binary metal-oxygen compounds, such as, for example, $ZnO$, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used for the first electrode 210. Furthermore, the TCOs do not necessarily correspond to a stoichiometric composition and can furthermore be p-doped or n-doped or be hole-conducting (p-TCO), or electron-conducting (n-TCO).

The first electrode 210 includes a layer or a layer stack of a plurality of layers of the same material or different materials. In one development, the first electrode 210 is formed by a layer stack of a combination of a layer of a metal on a layer of a TCO, or vice versa. One example is a silver layer applied on an indium tin oxide layer (ITO) (Ag on ITO) or ITO-Ag-ITO multilayers.

The first electrode has a layer thickness in a range of 10 nm to 500 nm, for example of less than 25 nm to 250 nm, for example of 50 nm to 100 nm.

The first electrode 210 is connected to a first electrical terminal 218, to which a first electrical potential can be applied. The first electrical potential is provided by a component-external energy source, for example a current source or a voltage source. Alternatively, the first electrical potential is applied to an electrically conductive carrier 202 and is electrically sent to the first electrode 210 indirectly through the carrier 202. The first electrical potential is for example the ground potential or some other predefined reference potential.

The organic functional layer structure 212 is formed on or above the first electrode 210 and arranged electrically between the first electrode 210 and the second electrode 214.

The organic functional layer structure 212 may include one, two or more functional layer structure units and one, two or more intermediate layer structure(s) between the layer structure units. The organic functional layer structure 212 may include for example a first organic functional layer structure unit 216, an intermediate layer structure 218 and a second organic functional layer structure unit 220.

The organic functional layer structure 212 includes one or a plurality of organic functional layer structures, for example 3, 4, 5, 6, 7, 8, 9, 10, or even more, for example 15 or more, for example 70, which are formed in each case identically or differently.

The organic functional layer structure 212 includes a hole injection layer, a hole transport layer, an emitter layer, an electron transport layer and an electron injection layer. The layers of the organic functional layer structure 212 are arranged between the electrodes 210, 214 in such a way that during operation electrical charge carriers can flow from the first electrode 210 through the organic functional layer structure unit 212 into the second electrode 214, and vice versa; for example in the order described below.

In the organic functional layer structure unit 212, one or a plurality of the layers mentioned can be provided, wherein identical layers can have a physical contact, can be only electrically connected to one another or can even be formed in a manner electrically insulated from one another, for example can be formed alongside one another. Individual layers of the layers mentioned can be optional.

The hole injection layer includes or is formed from one or a plurality of the following materials: HAT-CN, Cu(I)pFBz, $MoO_x$, $WO_x$, $VO_x$, $ReO_x$, F4-TCNQ, NDP-2, NDP-9, Bi(III) pFBz, F16CuPc; NPB (N,N'-bis(naphthalen-1-yl)-N,N'-bis (phenyl)benzidine); beta-NPB N,N'-bis(naphthalen-2-yl)-N, N'-bis(phenyl)benzidine); TPD (N,N'-bis(3-methylphenyl)-N,N'-bis(phenyl)benzidine); Spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethylfluorene); DMFL-NPB (N,N'-bis(naphthalen-1-yl)-N, N'-bis(phenyl)-9,9-dimethylfluorene); DPFL-TPD (N,N'-bis (3-methylphenyl)-N,N'-bis(phenyl)-9,9-diphenylfluorene); DPFL-NPB (N,N'-bis(naphthalen-1-yl)-N,N'-bis(phenyl)-9, 9-diphenylfluorene); Spiro-TAD (2,2',7,7'-tetrakis(n,n-diphenylamino)-9,9'-spirobifluorene); 9,9-bis[4-(N,N-bisbiphenyl-4-yl-amino)phenyl]-9H-fluorene; 9, 9-bis[4-(N,N-bis-napthalen-2-yl-amino)phenyl]-9H-fluorene; 9, 9-bis[4-(N,N'-bis-naphthalen-2-yl-N,N'-bisphenylamino)phenyl]-9H-fluorine; N,N'-bis(phenanthren-9-yl)-N,N'-bis(phenyl) benzidine; 2,7-bis[N,N-bis(9,9-spirobifluoren-2-yl)amino)-9,9-spirobifluorene; 2,2'-bis[N,N-bis(biphenyl-4-yl)amino] 9,9-spirobifluorene; 2,2'-bis(N,N-diphenylamino)]9,9-spirobifluorene; di-[4-(N,N-di-tolylamino)phenyl] cyclohexane; 2,2',7,7'-tetra(N,N-ditolyl) aminospirobifluorene; and/or N,N,N',N'-tetra-naphthalen-2-ylbenzidine.

The hole injection layer has a layer thickness in a range of approximately 10 nm to approximately 1000 nm, for example in a range of approximately 30 nm to approximately 300 nm, for example in a range of approximately 50 nm to approximately 200 nm.

The hole transport layer includes or is formed from one or a plurality of the following materials: NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-yl-amino)phenyl]-9H-fluorene; 9, 9-bis[4-(N,N'-bisnaphthalen-2-ylamino)phenyl]-9H-fluorene; 9, 9-bis[4-(N,N'-bisnaphthalen-2-yl-N,N'-bisphenylamino)phenyl]-9H-fluorine; N,N'-bis(phen-anthren-9-yl)-N,N'-bis(phenyl)benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)9,9-spirobifluorene; di-[4-(N,N-ditolyl-amino)phenyl]cyclohexane; 2,2',7,7'-tetra(N,N-di-ditolyl) aminospirobifluorene; and N,N,N',N'-tetranaphthalen-2-yl-benzidine, a tertiary amine, a carbazole derivative, a conductive polyaniline and/or polyethylene dioxythiophene.

The hole transport layer has a layer thickness in a range of approximately 5 nm to approximately 50 nm, for example in a range of approximately 10 nm to approximately 30 nm, for example approximately 20 nm.

An emitter layer includes or is formed from organic polymers, organic oligomers, organic monomers, organic small, non-polymeric molecules ("small molecules") or a combination of these materials. The optoelectronic component 110 includes or is formed from one or a plurality of the following materials in an emitter layer: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl)iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl-(2,2')-bipyridine] ruthenium(III) complex) and blue fluorescent DPAVBi (4,4-bis[4-(di-p-tolyl-amino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters can be deposited for example by means of thermal evaporation. Furthermore, polymer emitters can be used which can be deposited for example by means of a wet-chemical method, such as, for example, a spin coating method. The emitter materials can be embedded in a suitable manner in a matrix material, for example a technical ceramic or a polymer, for example an epoxy; or a silicone.

The emitter layer includes emitter materials that emit in one color or in different colors (for example blue and yellow or blue, green and red). Alternatively, the emitter layer includes a plurality of partial layers which emit light of different colors. By means of mixing the different colors, the emission of light having a white color impression can result. Alternatively, provision is also made for arranging a phosphor (converter material) in the beam path of the primary emission generated by said layers, which phosphor at least partly absorbs the primary radiation and emits a secondary radiation having a different wavelength, such that a white color impression results from a (not yet white) primary radiation by virtue of the combination of primary radiation and secondary radiation.

The emitter layer has a layer thickness in a range of approximately 5 nm to approximately 50 nm, for example in a range of approximately 10 nm to approximately 30 nm, for example approximately 20 nm.

The electron transport layer includes or is formed from one or a plurality of the following materials: NET-18; 2,2',2"-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di (naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2, 9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyl-dipyrenylphosphine oxide; naphthalenetetracarboxylic dianhydride or the imides thereof; perylenetetracarboxylic dianhydride or the imides thereof; and substances based on siloles including a silacyclopentadiene unit.

The electron transport layer has a layer thickness in a range of approximately 5 nm to approximately 50 nm, for example in a range of approximately 10 nm to approximately 30 nm, for example approximately 20 nm.

The electron injection layer includes or is formed from one or a plurality of the following materials: NDN-26, MgAg, Cs$_2$CO$_3$, Cs$_3$PO$_4$, Na, Ca, K, Mg, Cs, Li, LiF; 2,2',2"-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di (naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10] phenanthroline; phenyldipyrenylphosphine oxide; naphthalenetetracarboxylic dianhydride or the imides thereof; perylenetetracarboxylic dianhydride or the imides thereof; and substances based on siloles including a silacyclopentadiene unit.

The electron injection layer has a layer thickness in a range of approximately 5 nm to approximately 200 nm, for example in a range of approximately 20 nm to approximately 50 nm, for example approximately 30 nm.

In the case of an organic functional layer structure 212 including two or more organic functional layer structure units, the second organic functional layer structure unit is formed above or alongside the first functional layer structure units. An intermediate layer structure is formed electrically between the organic functional layer structure units.

The intermediate layer structure is formed as an intermediate electrode, for example in accordance with one of the configurations of the first electrode 210. An intermediate electrode is electrically connected to an external voltage source. The external voltage source provides a third electrical potential at the intermediate electrode.

Alternatively, however, the intermediate electrode has no external electrical connection, by the intermediate electrode having a floating electrical potential.

Alternatively, the intermediate layer structure is formed as a charge generating layer structure (charge generation layer CGL). A charge generating layer structure includes one or a plurality of electron-conducting charge generating layer(s) and one or a plurality of hole-conducting charge generating layer(s). The electron-conducting charge generating layer(s) and the hole-conducting charge generating layer(s) can be formed in each case from an intrinsically conductive substance or a dopant in a matrix. The charge generating layer structure should be formed, with respect to the energy levels of the electron-conducting charge generating layer(s) and the hole-conducting charge generating layer(s), in such a way that electron and hole can be separated at the interface between an electron-conducting charge generating layer and a hole-conducting charge generating layer. The charge generating layer structure furthermore has a diffusion barrier between adjacent layers.

The optoelectronic component 110 optionally includes further organic functional layers, for example arranged on or above the one or the plurality of emitter layers or on or above the electron transport layer(s). The further organic functional layers can be for example internal or external coupling-in/coupling-out structures that further improve the functionality and thus the efficiency of the optoelectronic component 110.

The second electrode 214 is formed in accordance with one of the configurations of the first electrode 210, wherein the first electrode 210 and the second electrode 214 can be formed identically or differently. The second electrode 214 is formed as an anode, that is to say as a hole-injecting electrode, or as a cathode, that is to say as an electron-injecting electrode.

The second electrode 214 has a second electrical terminal, to which a second electrical potential can be applied. The second electrical potential is provided by the same energy source as, or a different energy source than, the first electrical potential and/or the optional third electrical potential. The second electrical potential is different than the first electrical potential and/or the optionally third electrical potential. The second electrical potential has for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The barrier thin-film layer 208 is formed in accordance with one of the configurations of the barrier layer 204 described above.

Furthermore, it should be pointed out that, in exemplary embodiments, a barrier thin-film layer 208 can also be entirely dispensed with. In such a configuration, the encapsulation structure 226 includes a further barrier, as a result of which a barrier thin-film layer 208 becomes optional, for example a cover 224, for example a cavity glass encapsulation or metallic encapsulation.

Furthermore, in addition, one or a plurality of coupling-in/coupling-out layers are also formed in the optoelectronic component 110, for example an external coupling-out film on or above the carrier 202 (not illustrated) or an internal coupling-out layer (not illustrated) in the layer cross section of the optoelectronic component 110. The coupling-in/coupling-out layer includes a matrix and scattering centers distributed therein with respect to the electromagnetic radiation, wherein the average refractive index of the coupling-in/coupling-out layer is greater or less than the average refractive index of the layer from which the electromagnetic radiation is provided. Furthermore, in addition, one or a plurality of antireflection layers (for example combined with the second barrier thin-film layer 208) can be provided in the optoelectronic component 110.

The encapsulation structure furthermore includes a cover 224 and/or a connection layer 222. In one development, the cover 224 is connected to the active region 206, the substrate 106 and/or the barrier thin-film layer 208 by means of the connection layer 222. The connection layer 222 is optional, for example if the cover 224 is formed directly on the second barrier thin-film layer 208, for example a cover 224 composed of glass which is formed by means of plasma spraying.

The connection layer 222 is formed from an adhesive or a lacquer. In one development, a connection layer 222 composed of a transparent material includes particles which scatter electromagnetic radiation, for example light-scattering particles. As a result, the connection layer 222 acts as a scattering layer, which leads to an improvement in the color angle distortion and the coupling-out efficiency. The light-scattering particles provided can be dielectric scattering particles, for example composed of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide.

Other particles may also be suitable provided that they have a refractive index that is different than the effective refractive index of the matrix of the connection layer 222, for example air bubbles, acrylate, or hollow glass beads. Furthermore, by way of example, metallic nanoparticles, metals such as gold, silver, iron nanoparticles, or the like can be provided as light-scattering particles.

The connection layer 222 has a layer thickness of greater than 1 µm, for example a layer thickness of a plurality of µm.

In one development, between the second electrode 214 and the connection layer 222, an electrically insulating layer (not shown) is also formed, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

Furthermore, the optoelectronic component 110 may include a so-called getter layer or getter structure, for example a laterally structured getter layer (not illustrated). The getter layer includes or is formed from a material that absorbs and binds substances that are harmful to the electrically active region, for example water vapor and/or oxygen. A getter layer includes or is formed from a zeolite derivative, for example. The getter layer has a layer thickness of greater than approximately 1 µm, for example a layer thickness of a plurality of µm.

The cover 224 is formed or arranged on or above the connection layer 222. The cover 224 is connected to the electrically active region 206 by means of the connection layer 222 and protects said region from harmful substances. The cover 224 is for example a glass cover 224, a metal film cover 224 or a sealed plastics film cover 224. The glass cover 224 is connected for example by means of frit bonding (glass frit bonding/glass soldering/seal glass bonding) by means of a conventional glass solder in the geometric edge regions of the optoelectronic component 110.

In one development, a surface light source is formed as an organic light emitting diode. In the case of an optoelectronic assembly including two or more surface light sources, organic light emitting diodes formed as surface light sources are also referred to as OLED segments.

Figure 3:
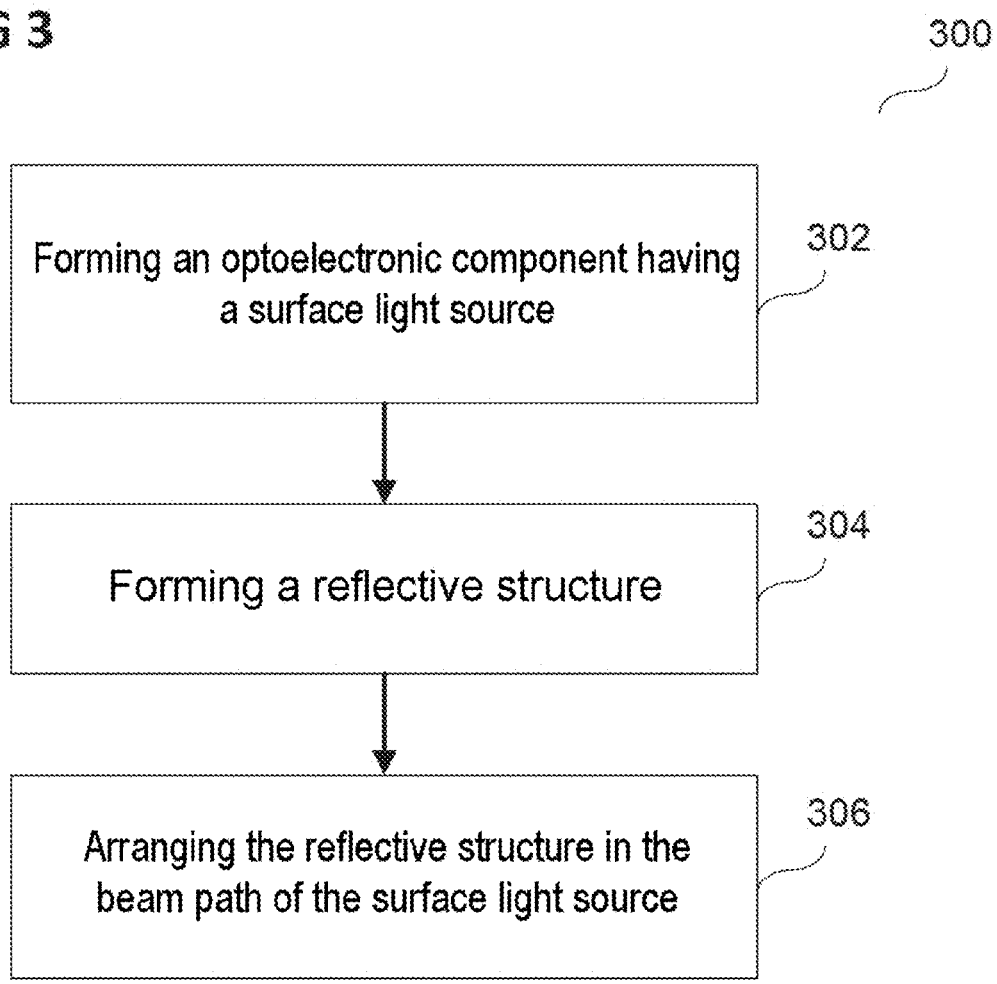
FIG. 3 shows a flow diagram of one exemplary embodiment of a method for producing an optoelectronic assembly.

FIG. 3 illustrates a flow diagram of one exemplary embodiment of a method 300 for producing an optoelectronic assembly 100, for example the optoelectronic assembly explained above.

The method serves to form an optoelectronic assembly which is designed for emitting a light 118, 116 into an image plane 130 and has a depth or spatial effect.

A first step 302 involves forming an optoelectronic component 110 having at least one surface light source 102 on a substrate 106.

A second step 304 involves forming a reflective structure 120.

A third step 306 involves arranging the reflective structure 120 at a distance 124 at least partly in the beam path of the optoelectronic component 110, such that the light emitted by the surface light source is at least partly reflected by the reflective structure and is emitted through the substrate.

In other words: a method 300 for producing an optoelectronic assembly 100 is provided. The method includes: forming 302 an optoelectronic component 110 having a surface light source 102 on a substrate 106, wherein the surface light source is formed for emitting a light 108, 118, and wherein the substrate 106 is formed such that it is at least partly transmissive for the light emitted by the surface light source 102; wherein the optoelectronic component 110 is formed in such a way that it includes at least one first main emission surface 112 and a second main emission surface 114, wherein the second main emission surface 112 is situated opposite the first main emission surface 114. Furthermore, the method 300 includes forming 304 a reflective structure 120 and arranging 306 the reflective structure 120 in such a way that the reflective structure 120 is arranged at least partly in the beam path of the light 108 emitted by the surface light source 102 and is designed to reflect at least part of the light 108 impinging on the reflective structure 120 in the direction of the substrate 106, such that the reflected light 116 is emitted through the substrate 106. The reflective structure 120 and the optoelectronic component 110 are arranged at a distance 124 from one another in a range of approximately 1 mm to approximately 1000 mm, for example in a range of approximately 3 mm to approximately 100 mm, for example in a range of approximately 5 mm to approximately 75 mm.

In other words: the surface light source 102 is arranged at a distance 124 above the reflective structure 120 in such a way that the substrate 106 and the reflective structure 120 and/or the partly transmissive structure 702 form an optical cavity.

In one development, forming 302 the optoelectronic component 110 includes segmenting a surface light source 102 into at least one first surface light source 102 and a second surface light source 402, 404, for example structuring at least one electrically conductive layer of the surface light source 102.

In one development, the optoelectronic component 110 is adhesively bonded on or above the reflective structure 120. In one development, an adhesive film is arranged in the beam path between the optoelectronic component 110 and the reflective structure 120. The adhesive film increases the optical path length of the light 108 in the optical cavity. Alternatively, the region of the beam path between the optoelectronic component 110 and the reflective structure 120 is free of adhesive film. In this case, the optoelectronic component is adhesively bonded to the reflective structure 120 in one or a plurality of optically inactive region(s).

In an optoelectronic component having two or more surface light sources formed in accordance with an organic light emitting diode 206 described in FIG. 2, the two or more surface light sources can be segmented or formed by means of structuring the second electrode 214 and/or the organic functional layer structure 212.

In one development, the surface light source 102 is formed such that it is at least partly transmissive for the light 116 reflected by the reflective structure 120.

In one development, the surface light source 102 is formed as a component which emits light on one side. Alternatively, the surface light source 102 is formed as a component which emits light at least bidirectionally.

In one development, at least one first surface light source 102 and a second surface light source 402, 404, 502, 504, 506 are formed on the substrate 106, as illustrated in even greater detail below. The first surface light source 102 emits a first light and the second surface light source 402, 404 emits a second light. The first surface light source 102 is formed at a first distance 406 alongside and/or above the second surface light source 402, 404, 502, 504, 506 on the substrate 106. The lateral distance makes it possible to differentiate the surface light sources in the image plane 130. In one development, the optoelectronic component is formed in such a way that the first surface light source 102 is at a lateral distance 406 from the second surface light source 402, 404 in a first region on the substrate 106; and is physically, electrically and/or optically connected to the second surface light source 402, 404 in a second region on the substrate 106; also see FIG. 4 and FIG. 5, for example.

Figure 4:
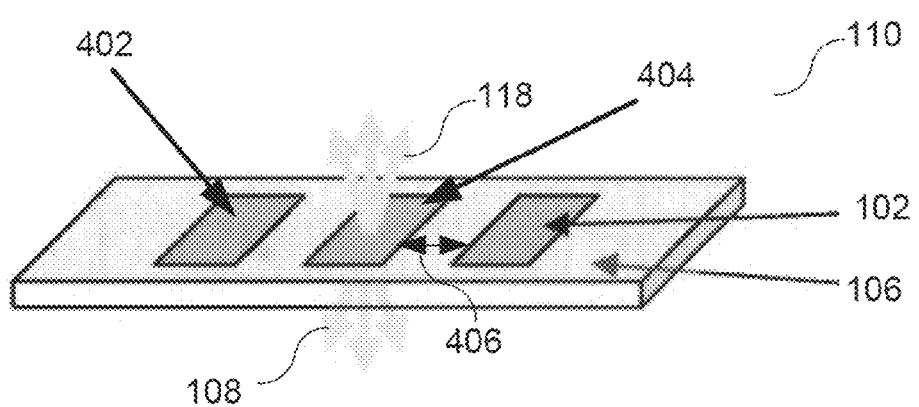
FIG. 4 shows a schematic illustration of a development of an optoelectronic component of the optoelectronic assembly.
Figure 5:
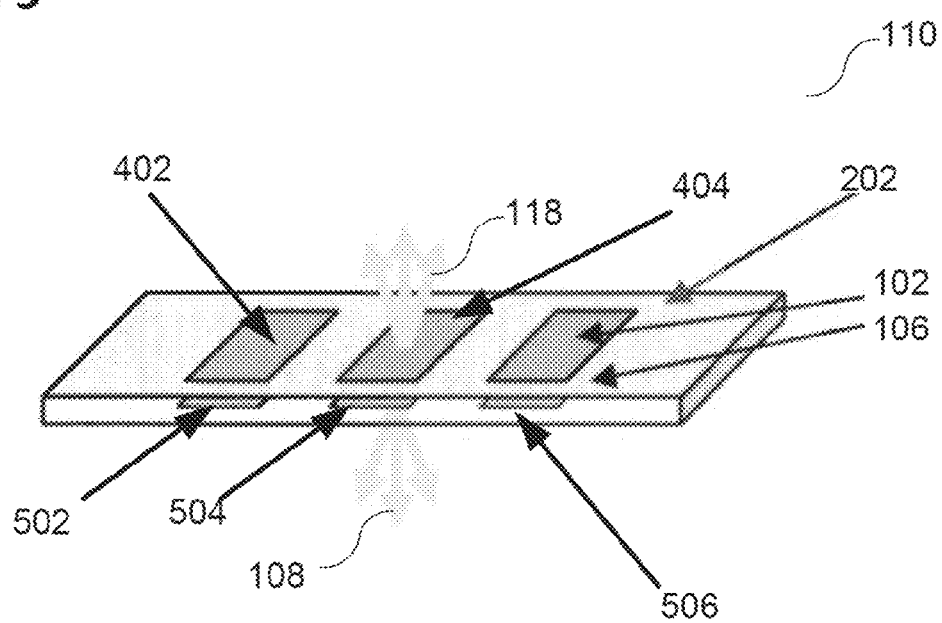
FIG. 5 shows a schematic illustration of a development of an optoelectronic component of the optoelectronic assembly.

In one development, the first surface light source 102 and the second surface light source 402, 404, 502, 504, 506 are formed in such a way that the first light differs from the second light in at least one property, for example in the color locus, in the brightness, in the saturation and/or in the color bin; also see FIG. 4 and FIG. 5, for example.

In one development, the first surface light source 102 is formed in such a way that the first light is emitted into the first main emission surface 112; and the second surface light source 402, 404, 502, 504, 506 is formed in such a way that the second light is emitted into the second main emission surface 114; also see FIG. 4 and FIG. 5, for example.

In one development, the first distance 406 is designed in such a way that the first surface light source 102 arranged alongside the second surface light source 402, 404, during the operation of the optoelectronic assembly 100, is optically differentiable from the second optoelectronic component 402, 404 in at least one image plane 130 of the optoelectronic assembly 100; also see FIG. 4 and FIG. 5, for example.

In one development, the substrate 106 is formed such that it is partly reflective for impinging light, for example for the light 116 reflected by the reflective structure 120; for example as a partly transmissive mirror.

In one development, the reflective structure 120 is formed with a reflective surface 122 and/or a reflective layer structure. The impinging light emitted by the surface light source 102 is reflected by the reflective surface 122 or reflective structure. In one development, the reflective surface 122 or reflective structure has a structuring, for example a curved, bent, concave, convex, trench-shaped and/or lens-shaped structuring.

In one development, the reflective structure 120 is formed such that it is at least partly transmissive for at least part of the light 108 impinging on the reflective structure 120, for example as a partly transmissive mirror.

Figure 7:
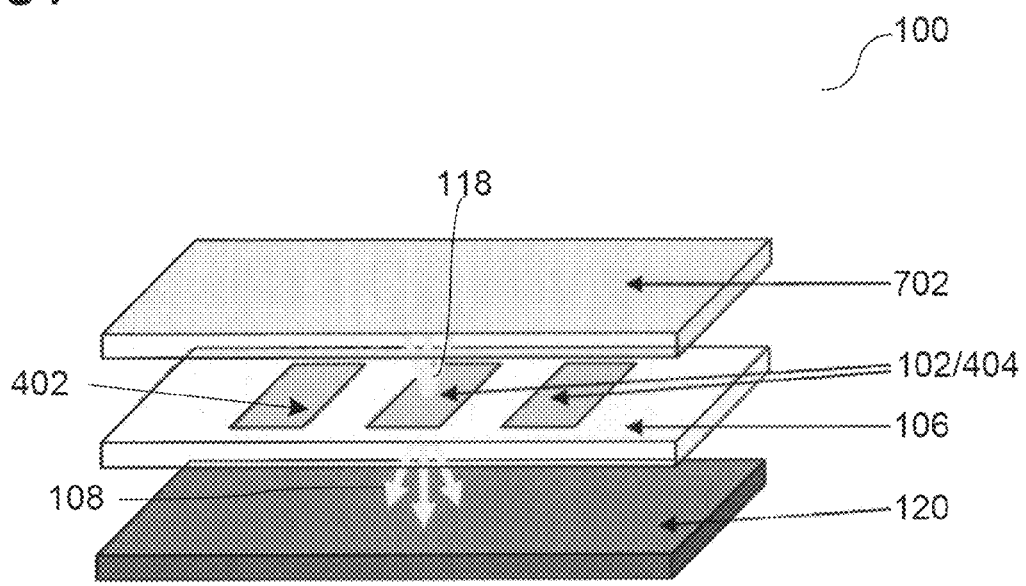
FIG. 7 shows a schematic illustration of a development of the optoelectronic assembly.

In one development, furthermore, an at least partly transmissive structure 702 is formed or arranged, for example illustrated in FIG. 7. The at least partly transmissive structure 702 is arranged between an image plane 130 of the optoelectronic assembly 100 and the optoelectronic component 110. The partly transmissive structure 702 is at least partly transmissive for light which impinges on the partly transmissive structure 702 from the surface light source 102 and/or the reflective structure 120, such that part of the impinging light 116, 118 is emitted through the partly transmissive structure 702; also see FIG. 7, for example.

In one development, the partly transmissive structure 702 is formed or arranged in such a way that at least part of the light 116, 118 which is emitted by the surface light source 102 and/or the reflective structure 120 in the direction of the partly transmissive structure 702 and impinges on the latter is reflected. By way of example, the partly transmissive structure 702 is formed as a partly transmissive mirror.

In one development, the surface light source 102 is formed with at least one at least partly reflective electrode 210, 214, see FIG. 2, for example. The at least partly reflective electrode 210, 214 is formed for reflecting the light 108, 118 emitted by the surface light source 102. The at least partly reflective electrode 210, 214 is formed as a part of the reflective structure 120.

In one development, the reflective structure 120 and/or the partly transmissive structure 702 are/is arranged with respect to the optoelectronic component 110 in such a way that the light 118 emitted directly by the surface light source 102 and the reflected light 108 have a lateral distance 402, such that a depth or spatial effect is formed during the operation of the optoelectronic assembly 100.

In one development, the reflective structure 120 is formed in such a way that the reflected light 116 differs from the light 108 emitted by the surface light source 102 and impinging on the reflective structure 120 in at least one property, for example in the color locus, the brightness, the saturation and/or the color bin. In one development, the reflective structure 120 is formed with or from a wavelength-converting substance.

In one development, the distance 124 between the surface light source 102 and the reflective structure 120 is designed in such a way that the light 108, 118 emitted by the surface light source 102 during the operation of the optoelectronic assembly 100 is optically differentiable, for example in a clearly evident manner, from the light 116 reflected by the reflective structure 120.

FIG. 4 illustrates a development of an optoelectronic component 110 of the optoelectronic assembly 100; which for example may largely correspond to an exemplary embodiment shown above.

The optoelectronic component includes at least one surface light source 102 or a plurality of surface light sources 102, 402, 404. The one or the plurality of surface light source(s) 102, 402, 404 emit light 108, 118 bidirectionally, for example illustrated in FIG. 4 with a first surface light source 102, a second surface light source 402 and a third surface light source 404.

In one development, the one or the plurality of surface light source(s) 102, 402, 404 are at least partly transparent. In other words: the surface light source(s) 102, 402, 404 are at least partly transmissive for the light 116 reflected by the reflective structure 120.

In other words: in one development, the optoelectronic component 110 includes on the substrate 106 at least one first surface light source 102 and a second surface light source 402, 404, wherein the first surface light source 102 emits a first light and the second surface light source 402, 404 emits a second light. The first surface light source 102 is arranged at a distance 406 alongside and/or above (for example illustrated in FIG. 5) the second surface light source 402, 404 on the substrate 106. In one development, the first surface light source 102 and the second surface light source 402, 404 are formed in such a way that the first light differs from the second light in at least one property, for example the color locus, the brightness, the saturation and/or the color bin.

In one development, the first surface light source 102 and the second surface light source 402, 404 are formed in such a way that the first light is emitted from the first main emission surface 112 in the direction of the image plane 130; and the second light is emitted from the second main emission surface 114 in the direction of the reflective structure 120.

In one development, the first surface light source 102 and the second surface light source 402, 404 are formed in such a way that the distance 406 between the surface light sources 102, 402, 404 during the operation of the optoelectronic assembly 100 is optically visible in at least one image plane 130 of the optoelectronic assembly 100.

FIG. 5 illustrates a development of an optoelectronic component 110 of the optoelectronic assembly 100; which may for example largely correspond to the exemplary embodiment shown above.

In one development, the optoelectronic component 110 includes one or a plurality of first surface light source(s) 102, 402 which emit(s) light into the first main emission surface 112, and one or a plurality of second surface light source(s) 502, 504, 506 which emit(s) light into the second main emission surface 114, for example illustrated in FIG. 5. In other words: the second surface light source 502, 504, 506 can be arranged alongside the first surface light source and/or in a manner facing away from the latter with regard to the emission direction of the respectively emitted light. In other words: a first surface light source 102 is formed or arranged on or above a second surface light source 502, 504, 506. By way of example, the first surface light source 102 has a direct physical contact with the second surface light source 506. Alternatively, a first surface light source 102 is formed or arranged on a first side of the substrate 106, and a second surface light source 506 is formed and arranged on a second side of the substrate 106, wherein the first side is situated opposite the second side.

In one development, the first surface light source 102 is arranged above the second surface light source 502, 504, 506 in such a way that the surface light sources overlap or are congruent with respect to one another. In other words: a first surface light source can be arranged directly above the second surface light source, such that the first surface light source overlaps the second surface light source, the first surface light source and the second surface light source are approximately congruent, or the second surface light source overlaps the first surface light source. As a result, in the case of non-transparent surface light sources, the optically inactive region of the optoelectronic assembly can be reduced. In the case of a congruent arrangement with respect to the first surface light source, the second surface light source can be referred to as a mirror light source, that is to say as a so-called mirror OLED in the case of OLEDs as surface light sources.

The first surface light source 102 and/or the second surface light source 502, 504, 506 can be formed as a so-called top emitter or bottom emitter, for example in accordance with the descriptions of FIG. 2. In other words: the light 118 emitted from the first main emission surface 112 is emitted by the first surface light source(s) 102, 402, 404; and the light 108 emitted from the second main emission surface 114 is emitted by the second surface light source(s) 502, 504, 506.

In one development, the optoelectronic component 110 includes at least one surface light source 102 which is at least partly transmissive for the light 116 reflected by the reflective structure 120. Additionally or alternatively, the surface light source 102 is formed as a component which emits light on one side.

In one development, the optoelectronic component 110 includes on the substrate 106 at least one first surface light source 102 and a second surface light source 402, 404, 502, 504, 506. The first surface light source 102 is formed for emitting a first light and the second surface light source 402, 404, 502, 504, 506 is formed for emitting a second light. The first surface light source is arranged at a first distance alongside and/or above the second surface light source 402, 502, 504, 506 on the substrate 106. In one development, the first light differs from the second light in at least one property, for example the color locus, the brightness, the saturation and/or the color bin. The first surface light source 102 is formed in such a way that the first light is emitted into the first main emission surface; and the second surface light source is formed in such a way that the second light is emitted into the second main emission surface.

Figure 6:
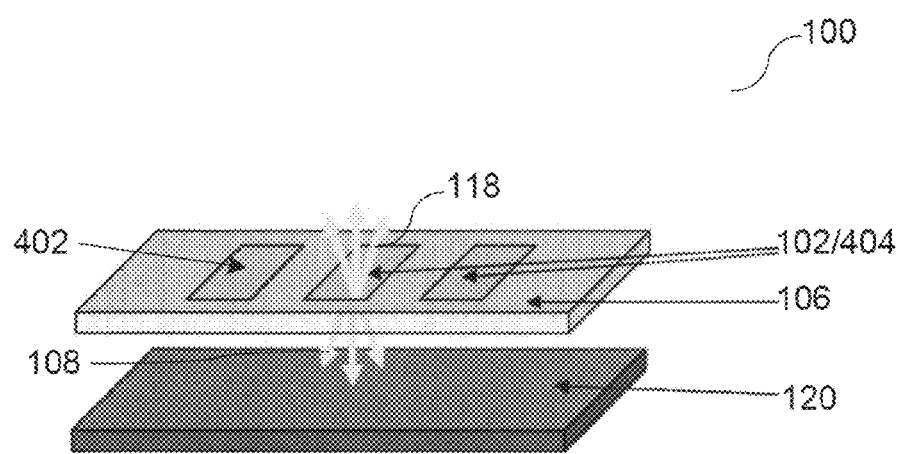
FIG. 6 shows a schematic illustration of a development of the optoelectronic assembly.

FIG. 6 illustrates a development of the optoelectronic assembly 100 which may for example largely correspond to the exemplary embodiment shown above.

FIG. 6 illustrates an optoelectronic assembly 100 including an optoelectronic component 110 in accordance with the descriptions of FIG. 4. In other words: the optoelectronic component 110 includes one or a plurality of surface light sources 102, 402, 404 which at least partly in a transparent fashion and bidirectionally emit light. This optoelectronic component 110 having a semitransparent substrate 106 is arranged at a distance above the reflective structure 120.

In one development, the reflective structure 120 can be formed as a mirror structure. A mirror structure differs from a reflective structure 120 in such a way that the mirror structure has a particularly smaller roughness, and hence little impinging light is scattered diffusely. A very accurate imaging of the surface light source is possible as a result.

FIG. 7 illustrates a schematic illustration of a development of the optoelectronic assembly 100 which may for example largely correspond to the exemplary embodiment shown above.

In one development, the optoelectronic assembly 100 additionally includes an at least partly transmissive structure 702. The optoelectronic component 110 is arranged between the reflective structure 120 and the partly transmissive structure 702. As a result, part of the light 116 (see FIG. 1), 118 which is emitted from the first main emission surface 112 is transmitted and partly reflected by the partly transmissive structure 702. Light 118 which is emitted directly by the surface light source 102 from the first main emission surface 112 is deflected in the direction of the reflective structure 120 by means of the partly transmissive structure 702. The proportion of light which impinges on the reflective structure 120 can be increased as a result. Said light is emitted by means of the reflection at the partly transmissive structure at least partly at a greater lateral distance from the directly emitted light 118 in the direction of the image plane 130. The spatial depth or the depth effect of the optoelectronic assembly 100 can be increased as a result.

In other words: in one development, the optoelectronic component 110 includes an at least partly transmissive structure 702. The at least partly transmissive structure 702 is arranged in the beam path of the light 116, 118 emitted from the first main emission surface 112 between an image plane 130 of the optoelectronic assembly 100 and the optoelectronic component 110. The partly transmissive structure 702 is at least partly transmissive for light 116, 118 which impinges on the partly transmissive structure 702 from the surface light source 102 and/or the reflective structure 120. The reflective structure 120 and/or the partly transmissive structure 702 are/is arranged with respect to the optoelectronic component 110 in such a way that the light 118 emitted directly by the surface light source 102 and the reflected light 116 have a lateral distance. As a result, a depth or spatial effect is formed during the operation of the optoelectronic assembly 100. The partly transmissive structure 702 is formed and arranged in such a way that at least part of the light 116, 118 impinging on the partly transmissive structure 702 from the surface light source 102 and/or the reflective structure 120 is reflected, for example is formed as a partly transmissive mirror. The surface light source 102 is arranged at a second distance 124 above the reflective structure 120 in such a way that the substrate 106 and the reflective structure 120, the surface light source 102, 402, 404, 502, 504, 506 and/or the partly transmissive structure 702 form an optical cavity. The second distance 124 between the surface light source 102, 402, 404, 502, 504, 506 and the reflective structure 120 is designed in such a way that the light 108, 118 emitted by the surface light source 102, 402, 404, 502, 504, 506 during the operation of the optoelectronic assembly 100 is optically differentiable from the light 120 reflected by the reflective structure 120.

In addition, the partly transmissive structure 702 can be formed as mechanical protection for the optoelectronic component 110, for example as an encapsulation structure 226 or a cover 224, as described for example in FIG. 2.

Figure 8:
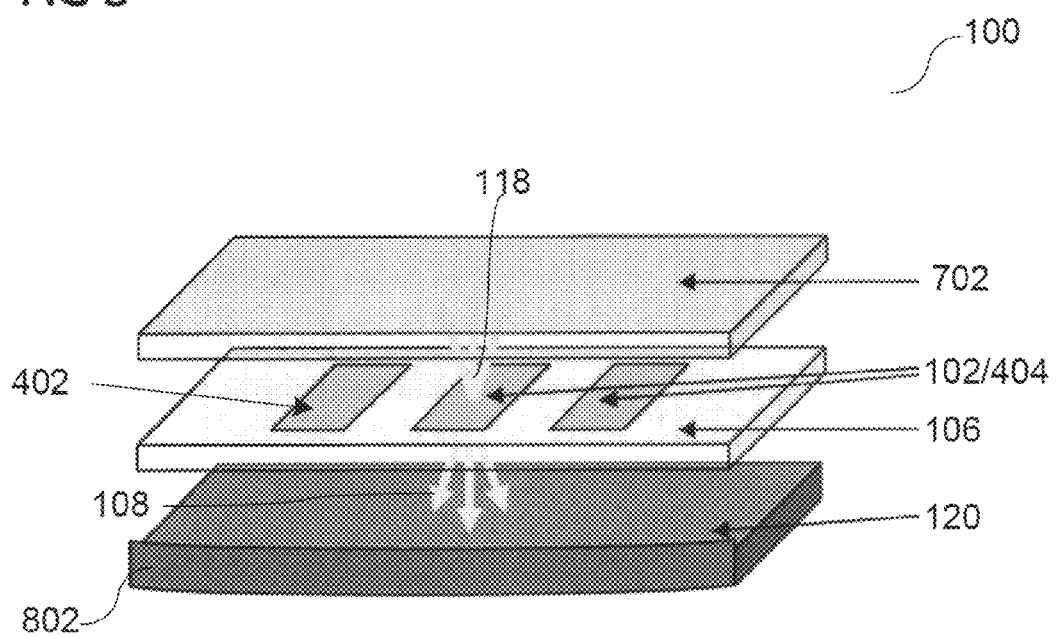
FIG. 8 shows a schematic illustration of a development of the optoelectronic assembly.

FIG. 8 illustrates a schematic illustration of a development of the optoelectronic assembly 100 which may for example largely correspond to the exemplary embodiment shown above.

The reflective structure 120 has a reflective surface 122 or a layer structure that is reflective at least for a wavelength range of the impinging light. As a result, the light which is emitted by the surface light source and impinges on the reflective structure is reflected. In other words: the reflective structure 120, the reflective layer structure and/or the reflective surface are/is structured. The reflective structure 120 is formed in such a way that the reflective surface 122 and/or the reflective layer structure have/has a curvature, a bend, a microstructure and/or a roughness, illustrated by means of the bent surface 802 in FIG. 8. The curvature of the reflective structure 120 can be convex and/or concave. The microstructure can have a trench structure, elevations and/or depressions. The reflective surface can have a structuring, for example at least one of the following forms: curved, bent, concave, convex, trench-shaped and/or lens-shaped. As a result, the reflective structure, for example in the form of a mirror structure, has a lens effect. As a result, it is possible for example to set the emission direction of the electromagnetic radiation 116 which is reflected at the reflective surface 122 and which is emitted to the substrate.

In one development, the substrate 106 is arranged in a manner substantially non-parallel or non-plane-parallel to the reflective surface 122 and/or reflective layer structure. As a result, the emission characteristic of the optoelectronic assembly 110 can be set in a simple manner.

In one development, the reflective structure 120 is formed in such a way that its transmissivity and/or its reflection coefficient are/is dependent on the wavelength and/or polarization of the light. A color-selective reflective structure 120 is realized as a result, for example a color-selective mirror. This enables a targeted color accentuation of the light 116, 118 visible in the image plane 130. In other words: the reflective structure 120 is formed in a color- and/or wavelength-selective fashion, for example as a photonic crystal. As a result, a targeted color accentuation can be made possible in the light emitted by the optoelectronic component. In other words: a targeted change in the color locus, the brightness and/or the saturation is made possible in a simple manner.

In one development, the reflective structure 120 is formed as a partly transparent or fully reflective mirror.

Figure 9:
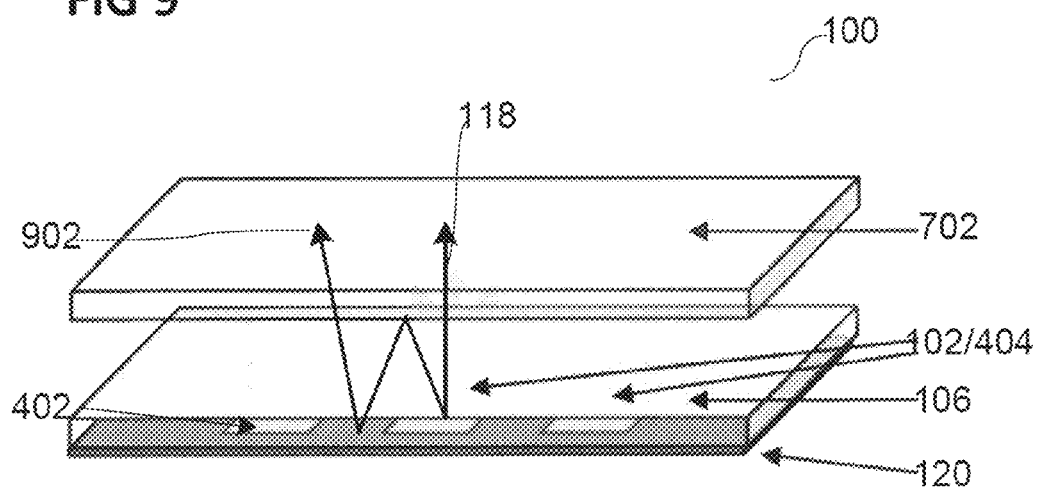
FIG. 9 shows a schematic illustration of a development of the optoelectronic assembly.

FIG. 9 illustrates a schematic illustration of a development of the optoelectronic assembly which may for example largely correspond to the exemplary embodiment shown above.

The optoelectronic component 110 includes one or a plurality of surface light sources 102, 402 which emit light on one side, that is to say are formed as a top emitter or a bottom emitter. The optoelectronic component 110 is arranged on the reflective structure 120. Alternatively, the rear side of the substrate 106 is provided by means of a reflective structure, for example by virtue of the fact that a metallic layer is deposited on the rear side of the substrate 106, and the at least one surface light source 102, 402, 404 emits through the substrate 106. The partly transmissive structure 702 is arranged above the substrate 106. Consequently, in the optoelectronic assembly 100 light 118 is emitted by the at least one surface light source 102, 402, 404 from the first main emission surface 112. Part of said light 118 is reflected at the partly transmissive structure 702 and deflected in the direction of the reflective structure 120. The light reflected by the partly transmissive structure 702 is reflected at the reflective surface of the reflective structure 120 and deflected in the direction of the partly transmissive structure 702 and partly emitted through the partly transmissive structure 702, for example illustrated by means of the reference sign 902 in FIG. 9. As a result, a lateral distance is formed between the directly emitted light 118 and the partly deflected and reflected light 902. The depth effect or spatial effect of the optoelectronic assembly 100 is realized by means of said distance. In this development, the distance between the optoelectronic component unit 110 and the reflective structure 120 is formed as an optical distance. The optical distance is set by means of the distance between the surface light source 102, 402 and the at least partly transmissive structure 702.

In one development, the reflective structure 120 is formed as an electrode of the optoelectronic component 110, for example as a bottom, first electrode 210. For this purpose, the first electrode 210 is formed from or includes a reflective electrically conductive material. In other words: in one development, the surface light source 102 includes at least one at least partly reflective electrode 210, 214. The at least partly reflective electrode 210, 214 is formed for reflecting the light 108, 118 emitted by the surface light source 102. The at least partly reflective electrode 210, 214 is at least one part of the reflective structure 210. In other words: the reflective structure 120 can consist of the transparent or specularly reflective cathode which is vapor-deposited over the entire substrate 106.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic assembly, comprising:
an optoelectronic component having a surface light source on a substrate,
wherein the surface light source is designed for emitting a light, and
wherein the substrate is formed such that it is at least partly transmissive for the light emitted by the surface light source;
wherein the optoelectronic component comprises at least one first main emission surface and a second main emission surface, wherein the second main emission surface is situated opposite the first main emission surface; and
a reflective structure, wherein the reflective structure is arranged at least partly in the beam path of the light emitted by the surface light source and is designed to reflect at least part of the light impinging on the reflective structure in the direction of the substrate;
wherein the reflective structure and the optoelectronic component are arranged at a distance from one another in a range of approximately 1 mm to approximately 1000 mm,
wherein the substrate includes an optically inactive region alongside the surface light source, so that the reflected light is emitted alongside the surface light source through the substrate, such that a laterally offset image of the surface light source is generatable.

2. The optoelectronic assembly as claimed in claim 1, wherein the surface light source is at least partly transmissive for the light reflected by the reflective structure.

3. The optoelectronic assembly as claimed in claim 1, wherein the surface light source is formed as a component which emits light on one side.

4. The optoelectronic assembly as claimed in claim 1, wherein the surface light source is formed as a component which emits light at least bidirectionally.

5. The optoelectronic assembly as claimed in claim 1, wherein the optoelectronic component comprises on the substrate at least one first surface light source and a second surface light source, wherein the first surface light source emits a first light and the second surface light source emits a second light, wherein the first surface light source is arranged at a first distance alongside and/or above the second surface light source on the substrate.

6. The optoelectronic assembly as claimed in claim 5, wherein the first light differs from the second light in at least one property.

7. The optoelectronic assembly as claimed in claim 5, wherein the first surface light source is formed in such a way that the first light is emitted into the first main emission surface, and the second surface light source is formed in such a way as to emit the second light into the second main emission surface.

8. The optoelectronic assembly as claimed in claim 5, wherein the first light differs from the second light in at least one property; wherein the first surface light source is formed in such a way that the first light is emitted into the first main emission surface, and the second surface light source is formed in such a way as to emit the second light into the second main emission surface.

9. The optoelectronic assembly as claimed in claim 1, wherein the substrate is formed such that it is partly reflective for impinging light.

10. The optoelectronic assembly as claimed in claim 1, wherein the reflective structure is formed such that it is at least partly transmissive for at least part of the light impinging on the reflective structure.

11. The optoelectronic assembly as claimed in claim 1, further comprising:
   an at least partly transmissive structure arranged in the beam path of the emitted light between an image plane of the optoelectronic assembly and the optoelectronic component; wherein the partly transmissive structure is at least partly transmissive for light which impinges on the partly transmissive structure from the surface light source and/or the reflective structure.

12. The optoelectronic assembly as claimed in claim 11, wherein the partly transmissive structure is formed and arranged such that at least part of the light impinging on the partly transmissive structure from the surface light source and/or the reflective structure is reflected.

13. The optoelectronic assembly as claimed in claim 11, wherein the surface light source comprises at least one at least partly reflective electrode, wherein the at least partly reflective electrode is formed for reflecting the light emitted by the surface light source, wherein the at least partly reflective electrode (210, 214) is at least one part of the reflective structure.

14. The optoelectronic assembly as claimed in claim 11, wherein the partly transmissive structure is formed and arranged such that at least part of the light impinging on the partly transmissive structure from the surface light source and/or the reflective structure is reflected;
   wherein the surface light source comprises at least one at least partly reflective electrode, wherein the at least partly reflective electrode is formed for reflecting the light emitted by the surface light source, wherein the at least partly reflective electrode is at least one part of the reflective structure.

15. A method for producing an optoelectronic assembly, the method comprising:
   forming an optoelectronic component having a surface light source on a substrate,
      wherein the surface light source is formed for emitting a light,
      wherein the substrate is formed such that it is at least partly transmissive for the light emitted by the surface light source; and
      wherein the substrate includes an optically inactive region alongside the surface light source;
   wherein the optoelectronic component is formed in such a way that it comprises at least one first main emission surface and a second main emission surface, wherein the second main emission surface is situated opposite the first main emission surface;
   forming a reflective structure and arranging the reflective structure in such a way that the reflective structure is arranged at least partly in the beam path of the light emitted by the surface light source and is designed to reflect at least part of the light impinging on the reflective structure in the direction of the substrate, such that the reflected light alongside the surface light source is emitted through the substrate, such that a laterally offset image of the surface light source is generatable; and
   wherein the reflective structure and the optoelectronic component are arranged at a distance from one another in a range of approximately 1 mm to approximately 1000 mm.

16. The method as claimed in claim 15, wherein forming the optoelectronic component comprises segmenting a surface light source into at least one first surface light source and a second surface light source.

17. The method as claimed in claim 15, wherein the optoelectronic component is adhesively bonded on or above the reflective structure.

18. The method as claimed in claim 15, wherein forming the optoelectronic component comprises segmenting a surface light source into at least one first surface light source and a second surface light source; wherein the optoelectronic component is adhesively bonded on or above the reflective structure.

* * * * *